(12) United States Patent
Cheng et al.

(10) Patent No.: US 7,843,017 B2
(45) Date of Patent: Nov. 30, 2010

(54) START-UP CONTROL DEVICE

(75) Inventors: Chien-Hsing Cheng, Taipei (TW); Kuang-Ming Chang, ChungLi (TW)

(73) Assignee: Richtek Technology Corporation, Hsin-Chu (TW)

( * ) Notice: Subject to any disclaimer, the term of this patent is extended or adjusted under 35 U.S.C. 154(b) by 956 days.

(21) Appl. No.: 11/657,494

(22) Filed: Jan. 24, 2007

(65) Prior Publication Data

US 2008/0073675 A1    Mar. 27, 2008

(30) Foreign Application Priority Data

Sep. 22, 2006    (TW) .............................. 95135099 A

(51) Int. Cl.
*H01L 27/088*    (2006.01)
(52) U.S. Cl. .............................. 257/392; 257/E27.061
(58) Field of Classification Search ......... 257/262–278, 257/327–345, 213, 288, 368, 392, E27.009, 257/E27.01, E27.046, E27.059, E27.06, E27.061; 327/530–550

See application file for complete search history.

(56) References Cited

U.S. PATENT DOCUMENTS

| 4,609,833 | A | * | 9/1986 | Guterman | 327/537 |
| 4,857,823 | A | * | 8/1989 | Bitting | 323/314 |
| 5,294,814 | A | * | 3/1994 | Das | 257/77 |
| 6,696,884 | B1 | * | 2/2004 | Seven | 327/540 |

* cited by examiner

*Primary Examiner*—Minh-Loan T Tran
*Assistant Examiner*—Kevin Quinto
(74) *Attorney, Agent, or Firm*—Tung & Associates

(57) ABSTRACT

A transistor having a start-up control element is provided. The transistor includes an N-type depletion mode transistor and an N-type enhancement mode transistor. The N-type depletion mode transistor includes a drain for electrically connecting to an external power supply, and a gate normally grounded. The N-type enhancement mode transistor includes a drain electrically connected to the external power supply, and a gate electrically connected to a source of the depletion mode transistor.

18 Claims, 12 Drawing Sheets

START-UP CONTROL DEVICE

BACKGROUND

1. Field of Invention

The present invention relates to a transistor having a start-up control element. More particularly, the present invention relates to a metal-oxide-semiconductor field-effect transistor (MOSFET) having a start-up control element as a power switch.

2. Description of Related Art

A start-up circuit is often required when a power supply circuit supplies voltage to a power circuit within an integrated circuit (IC). The start-up circuit provides a starting bias voltage to the power circuit until the power circuit is able to function normally. Afterwards, the start-up circuit is expected to be idle and consume no power, if ideally. FIG. 1 is a diagram illustrating relationships among a start-up circuit 10, a power supply 100 and a power circuit 200. During initialization stage, the power circuit 200 has not been fed with power. Therefore, it is necessary to provide a start-up circuit 10 to charge the capacitor C until the voltage at the node Vbias reaches a predetermined value that is able to turn ON the power circuit 200. After the power circuit 200 is turned ON, it may operate without any aid from the start-up circuit 10. For example, the power circuit 200 may obtain power from the power supply 100 via some other approach (other than the start-up circuit 10) and transfer the power into a low DC voltage Vdd required by the IC. The details are not described here for that they are well known to those skilled in the art.

FIG. 2 is a diagram illustrating a prior art start-up circuit. Since the start-up circuit 10 is expected to consume as little current as possible, the simplest approach is to provide a resistor 20 of high resistance. The resistor 20 transfers the voltage from the power supply 100 to a low current, charging the capacitor C until the node Vbias reaches a predetermined voltage value. The voltage at the node Vbias, for example, may be provided to drive a pulse width modulation (PWM) circuit 12 in the power circuit 200, and the power circuit operates under the control of the PWM circuit 12. The details of the PWM circuit and how it controls the power circuit 200 are not described here for that they are well known to those skilled in the art.

According to the prior art illustrated in FIG. 2, the resistance of the resistor 20 must be quite large to limit the current, because the voltage provided by the power supply 100 is quite high. Accordingly, the area of the resistor 20 inevitably becomes very large, and a huge amount of heat is generated. Moreover, such start-up circuit cannot be turned off; the serious problems of power consumption and heat generation go on even after the power circuit has been started up.

Another start-up circuit is disclosed in U.S. Pat. No. 5,285,369, "Switched Mode Power Supply Integrated Circuit with Start up Self Biasing". The disclosed circuit is very complicated, and a simplified form thereof is illustrated in FIG. 3. This prior art utilizes the characteristics of the parasitic junction transistor inherently existing with a metal-oxide-semiconductor field-effect transistor (MOSFET) As shown in the figure, the MOSFET 84 may be taken as a combination of a junction field-effect transistor (JFET) 86 and a MOSFET 88. The JFET 86 is a depletion mode transistor, inherently capable of limiting current, and it is normally in an ON state as its gate is electrically connected to ground. The node between the JFET 86 and the MOSFET 88 provides current for starting up a control circuit 14. The control circuit 14 provides two functions: on the one hand, the control circuit 14 charges the capacitor C; on the other hand, when the voltage at the node Vbias reaches a predetermined value, the control circuit 14 generates a control signal to switch off the MOSFET 88 and turn off the start-up circuit formed by the MOSFET 84 and the control circuit 14.

Though the conventional start-up circuit illustrated in FIG. 3 can be automatically turned off and the heat generated by the circuit is much less than that in FIG. 2, the structure of the control circuit 14 is too complicated (as may be understood by referring to the details thereof), which is undesired.

Therefore, another circuit structure is disclosed in U.S. Pat. No. 5,477,175 "Off-Line Bootstrap Start up Circuit", which is simpler than the circuit in FIG. 3. As illustrated in FIG. 4, the circuit disclosed in U.S. Pat. No. 5,477,175 obtains current from the node between the JFET 101 and the MOSFET 102, and transfers the current to voltage by a resistor 103, which is supplied to the gate of the MOSFET 102 to turn ON the MOSFET 102. After the power circuit 200 is started, the transistor 109 can be switched off by controlling the node 113. That is, the current flowing through the resistor 103 can be turned off.

Though the complexity of the circuit illustrated in FIG. 4 is reduced as compared to the circuit disclosed in U.S. Pat. No. 5,285,369, it is still not satisfactory. Namely, the utilization of the resistor 103 still results in heat dissipation problem. It is true that the resistor 103 needs not be too large because it is only required to provide a voltage sufficient to turn ON the MOSFET 102, and hence the heat dissipation problem is less severe than the circuit illustrated in FIG. 2. However, it is still not good enough.

In view of the foregoing, it is desired to provide an advanced start-up circuit which has a simple circuit structure but does not include any resistor, to avoid the drawbacks in the prior art.

SUMMARY

It is therefore an aspect of the present invention to provide a transistor having a start-up element with a simple structure to be used as a start-up circuit.

It is another aspect of the present invention to provide a start-up circuit.

It is still another aspect of the present invention to provide a semiconductor device for start-up control.

In accordance with the foregoing and other aspects of the present invention, and as disclosed by one embodiment of the present invention, a transistor having a start-up element comprises an N-type depletion mode transistor, including a drain for electrically connecting to an external power supply, and a gate normally grounded; and an N-type enhancement mode transistor, including a drain electrically connected to the external power supply, and a gate connected to a source of the depletion mode transistor.

Further, according to another embodiment of the present invention, a start-up circuit is provided. The start-up circuit includes a depletion mode transistor normally in an ON state, and an enhancement mode transistor electrically connected with the depletion mode transistor in partially parallel, wherein a drain of the enhancement mode transistor and a drain of the depletion mode transistor are electrically coupled, and a source of the depletion mode transistor is electrically coupled to a gate of the enhancement mode transistor.

Preferably, the transistors described above are vertical transistors. Also preferably, the two transistors may be integrated into a discrete device.

In accordance with yet another embodiment, a semiconductor device is provided. The semiconductor device includes a substrate of a first conductivity type; a first well of a second conductivity type located in the substrate; a second well of the first conductivity type located in the substrate, wherein the second well and the substrate are normally conductive to each other; a first gate of the first conductivity type, capable of cooperating with the first well to pinch-off the conduction between the second well and the substrate when the first gate is biased; a third well of the first conductivity type located in the substrate; a fourth well of the second conductivity type located in the substrate, the fourth well separating the third well and the substrate; and a second gate of the first conductivity type, capable of activating the conduction between the third well and the substrate when the second gate is biased.

In the aforementioned embodiment, the substrate may include a body and an epitaxy layer. The first gate may include a conductive layer on the substrate, or a well in the substrate.

It is to be understood that both the foregoing general description and the following detailed description are provided as examples, for illustration rather than limiting the scope of the invention.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

The drawings as referred to throughout the description of the present invention are for illustration only, but not drawn according to actual scale.

Figure 5:
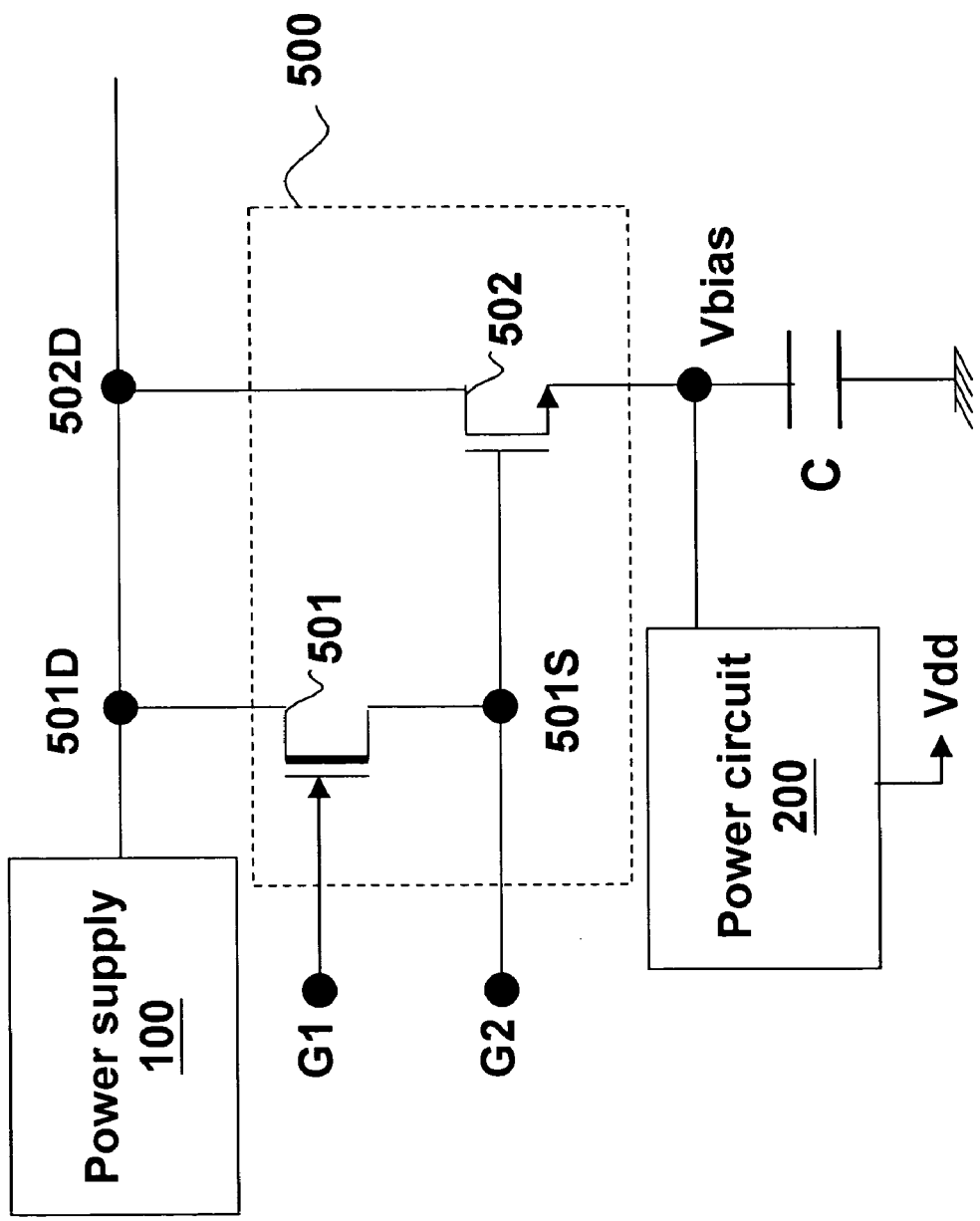
FIG. 5 is a circuit diagram of a preferred embodiment of the present invention.

FIG. 5 is a circuit diagram illustrating an embodiment of the present invention. In the embodiment, the start-up circuit 500 between the power supply 100 and the power circuit 200 includes a depletion mode transistor 501, serving as a start-up control element, and an enhancement mode transistor 502, serving as a power device. The enhancement mode transistor 502 will be referred to simply as "the transistor" 502 for simplicity hereinafter.

As shown in the figure, in one preferred embodied form, the transistors 501 and 502 are both made of MOSFETs, for better process integration in fabrication. The two transistors may be integrated as one discrete device therefore. However, MOSFETs are only exemplary but not necessary. For example, the depletion mode transistor 501 may instead be a junction transistor; the corresponding circuit diagram is as shown in FIG. 6.

Figure 6:
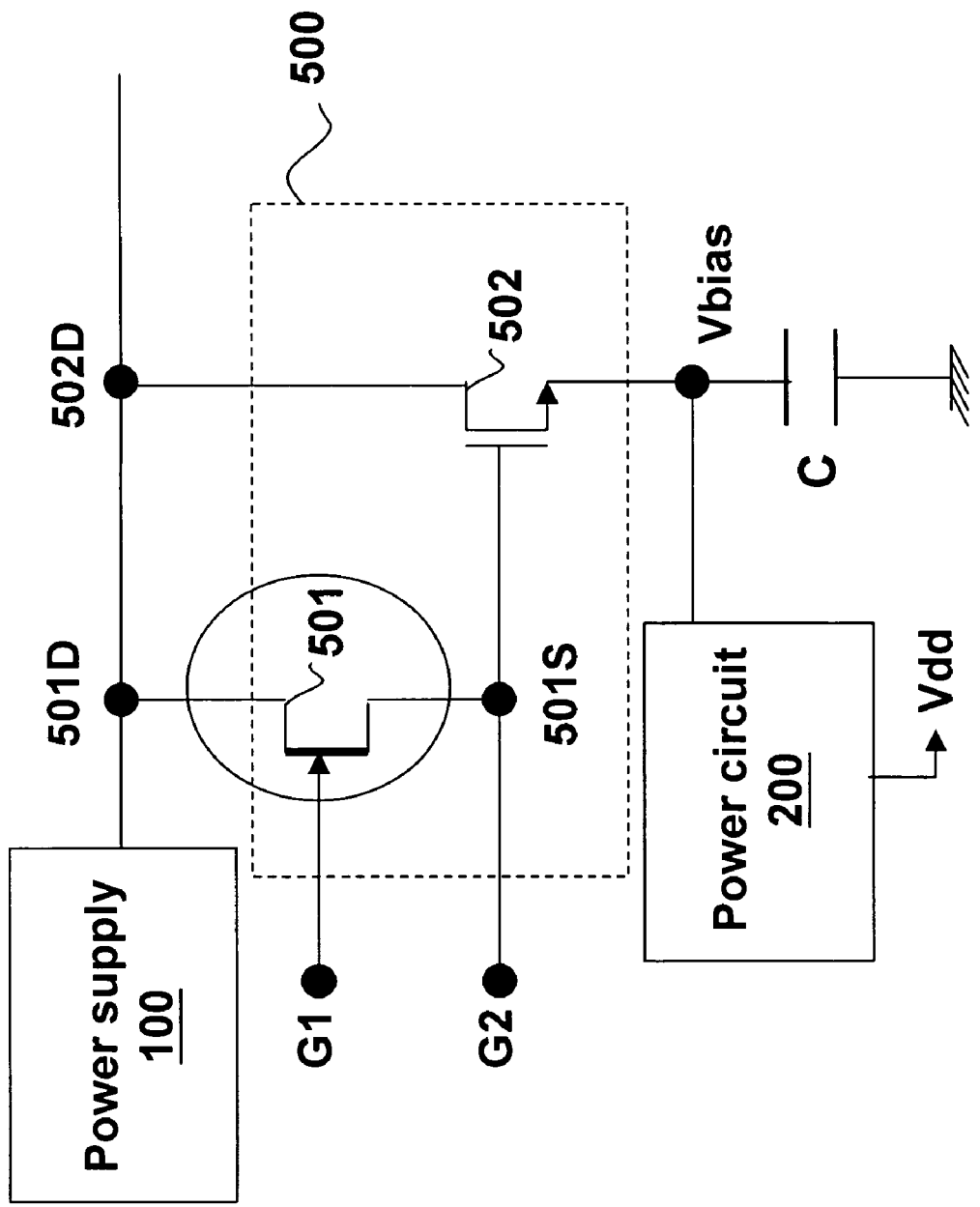
FIG. 6 is a circuit diagram of another preferred embodiment of the present invention.

Referring to FIG. 5 and FIG. 6, the depletion mode transistor 501 includes a gate node G1. In one embodiment, the gate node G1 is electrically connected to a control node (not shown in FIG. 5 and FIG. 6) within the power circuit 200. In another embodiment, the gate node G1 may be permanently grounded. In the first embodiment, since there is no current flowing on the power circuit 200 in the initialization stage, there is no voltage at the gate node G1, which is substantially equivalent to being grounded. Therefore, in both the first embodiment and in the second embodiment, the depletion mode transistor 501 is in an On state in the initialization stage. The drain 501D of the depletion mode transistor 501 is electrically connected to the power supply, and the source 501S of the depletion mode transistor 501 is electrically connected to the gate of the transistor 502, which is subject to the control of a control node G2. The current flowing on the depletion mode transistor 501 is transferred to voltage at the control node G2, which turns ON the transistor 502. The drain 502D of the transistor 502 is electrically connected to the power supply, and the source of the transistor 502 is electrically connected to the capacitor C in order to generate a biasing voltage at the node Vbias.

At the initialization stage, the current may flow through the depletion mode transistor 501 and the node G2, and then to a control circuit (not shown) connected with the node G2, since the depletion mode transistor 501 is normally ON. As mentioned above, the control circuit may generate a voltage at the gate of the transistor 502 to turn ON the transistor 502. When the transistor 502 is turned ON, the capacitor C is then charged. As the voltage at the node Vbias increases, the span voltage VG2S between the gate and the source of the transistor 502 decreases. When the span voltage VG2S is lower than a threshold voltage VT, the transistor 502 cuts off automatically. In other words, the voltage on the capacitor C is limited under a maximum value in accordance. This is one of the features of the present invention.

When the voltage on the capacitor C reaches a predetermined value, the power circuit 200 is started up. The current generated by the power circuit 200 may be utilized to control the control circuit (not shown) connected to the node G2 to pull down the voltage at the node G2 and turn OFF the transistor 502 accordingly. Further, in the first embodiment described above, where the gate node G1 of the depletion mode transistor 501 is not permanently grounded, the transistor 501 can be turned OFF by controlling the voltage at the gate node G1 for saving power. Or, in the second embodiment, there is still few current flowing on the transistor 501, but this is tolerable since the depletion mode transistor is able to control the current loss by its inherent current limitation ability. Of course, where possible, one may properly design the circuit so that such few current that is still flowing through the transistor 501 may be constructively used.

Figure 1:
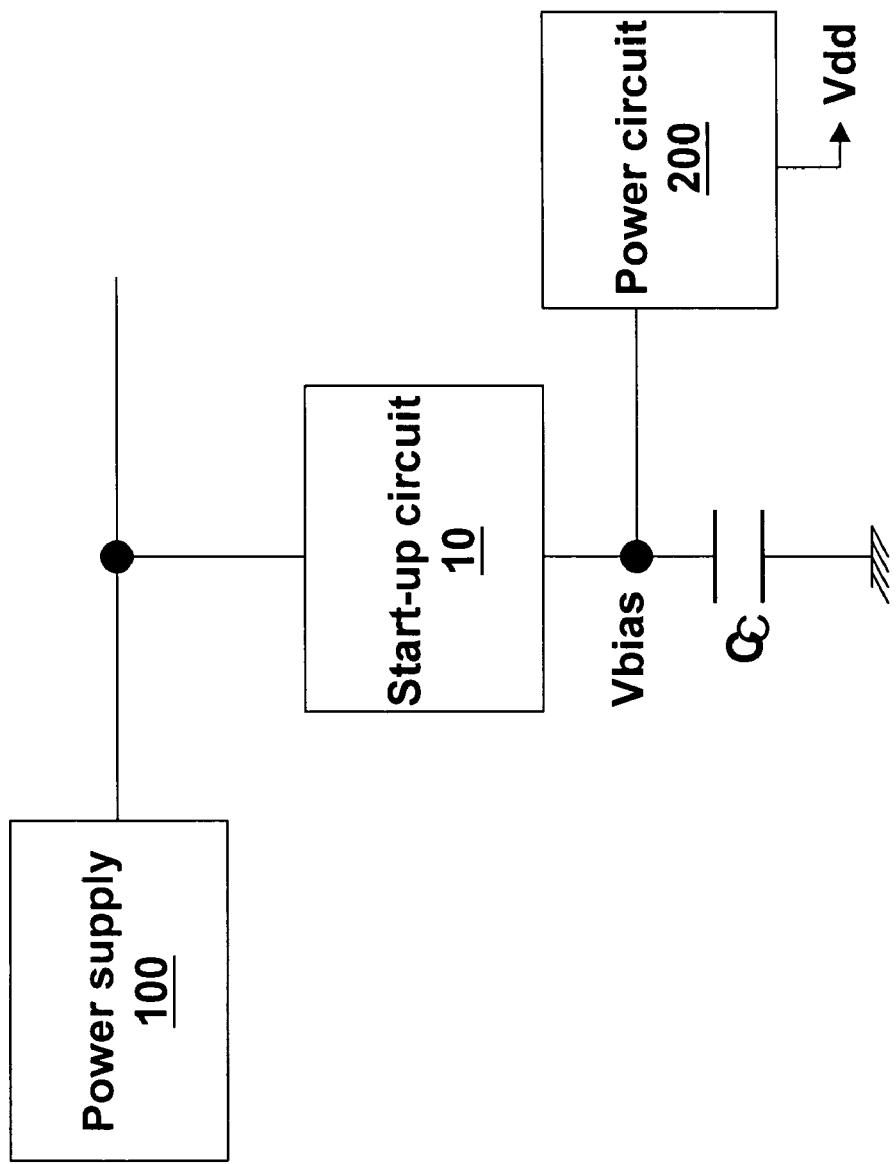
FIG. 1 is a diagram showing a typical structure of a start-up circuit.
Figure 2:
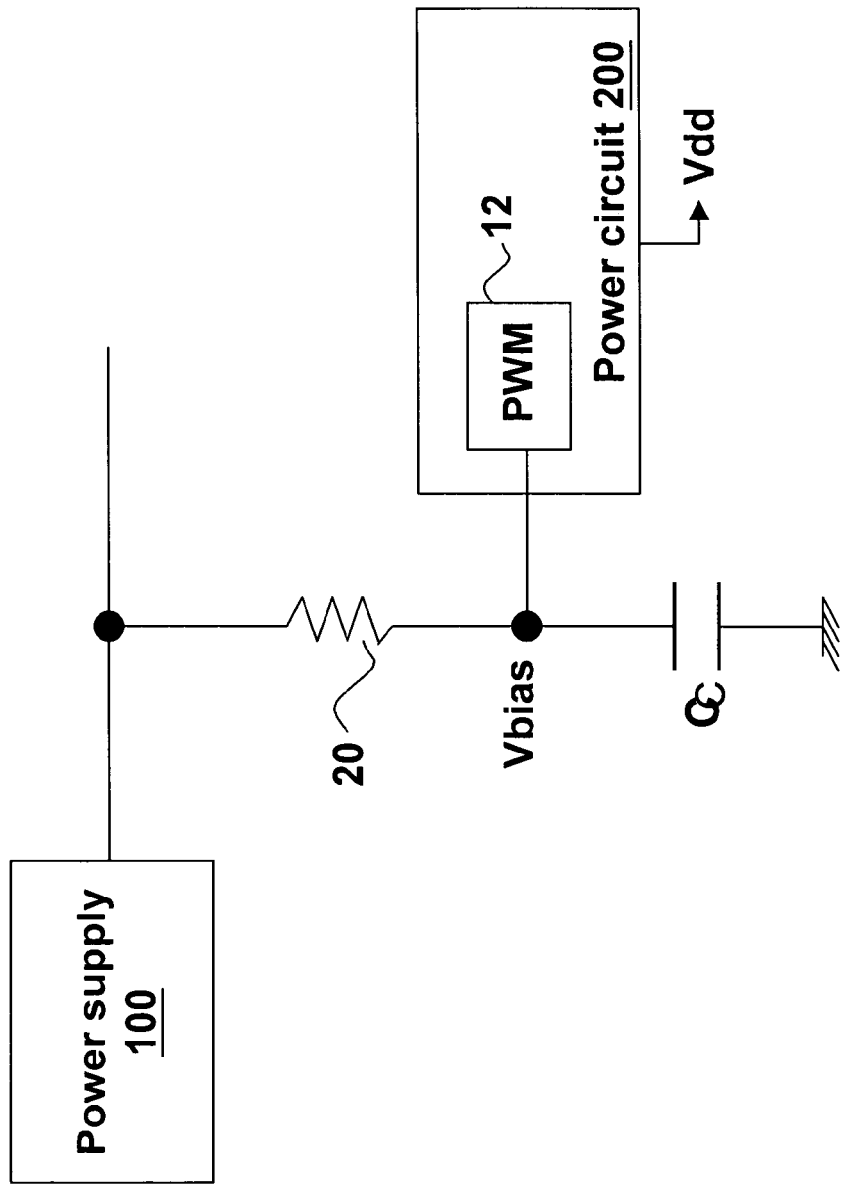
FIG. 2 is a circuit diagram of a conventional start-up circuit having a resistor.
Figure 3:
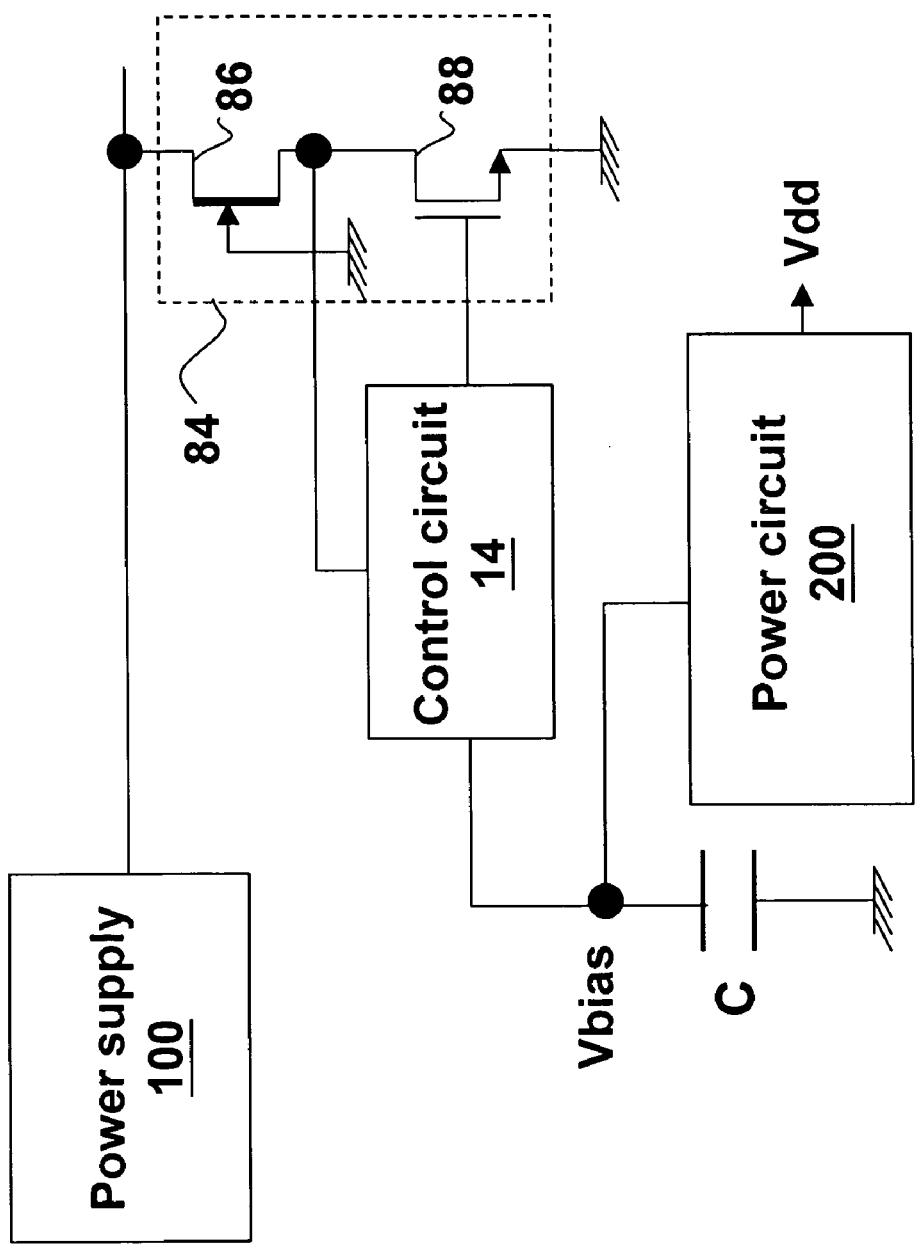
FIG. 3 is a circuit diagram showing another prior art start-up circuit.
Figure 4:
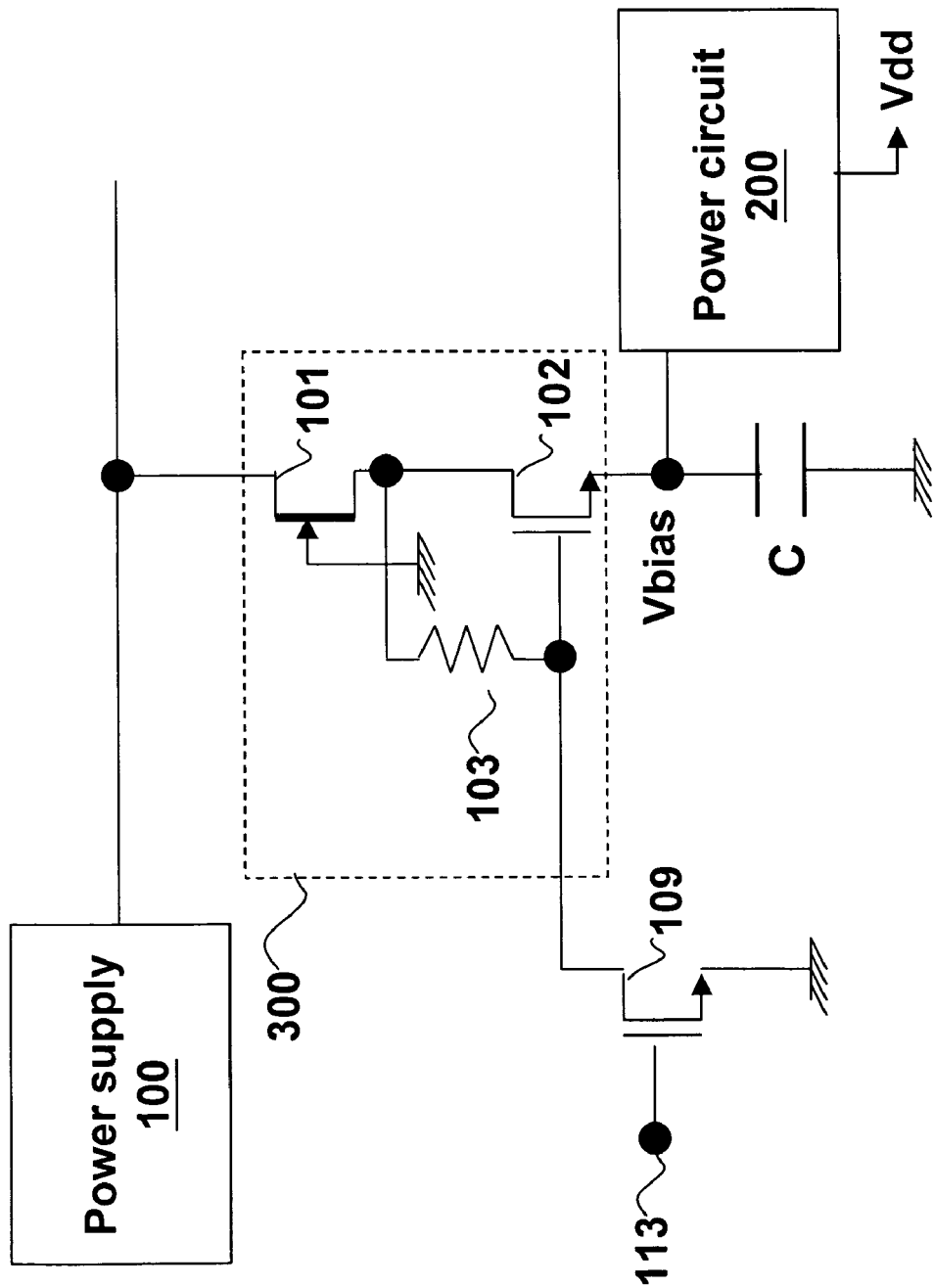
FIG. 4 is a circuit diagram showing yet another prior art start-up circuit.

In the aforementioned circuits, no complicated control mechanism is required. The circuit structure is simpler than the circuit shown in FIG. 4. Besides, no resistor is employed, and hence there is no heat dissipation problem.

Figure 7:
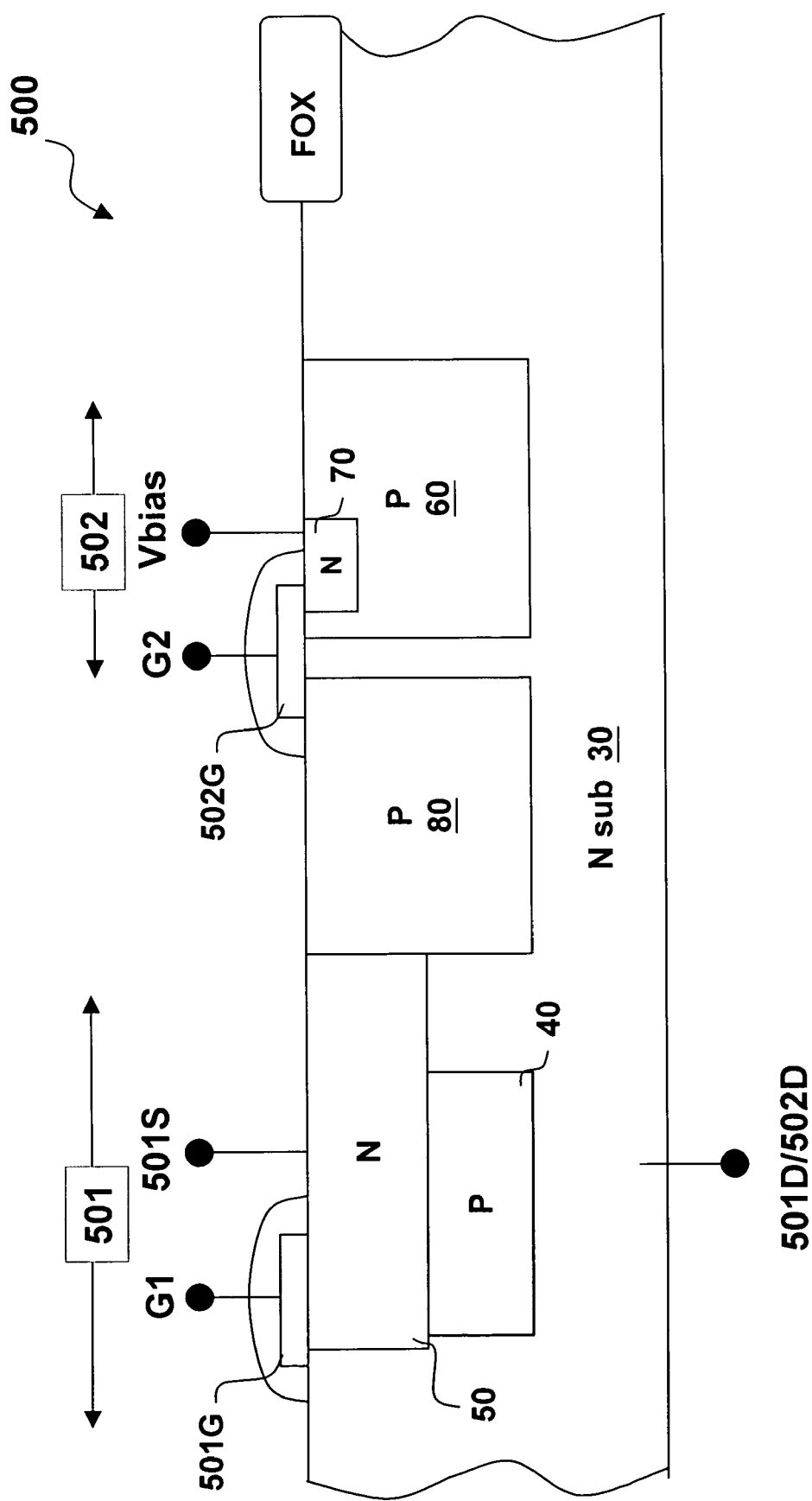
FIG. 7 is a semiconductor cross-sectional diagram of a preferred embodiment of the present invention.

According to one preferred embodiment, the semiconductor structure of the circuit illustrated in FIG. 5 is shown in FIG. 7. FIG. 7 is a simplified semiconductor cross-sectional diagram. Referring to FIG. 7, there is an N-type well 50 in an N-type substrate 30, and a P-type well 40 is located below the N-type well 50. The N-type substrate 30 and the N-type well 50 form the drain and the source of the depletion mode transistor 501, respectively. Further, the N-type substrate 30 and the N-type well 50 are electrically connected, so the formed transistor is a depletion mode transistor. When the gate 501G is biased, the gate 501G and the P-type well 40 pinch-off the depletion mode transistor. Please note that, the depletion mode transistor 501 is a vertical transistor, which is another feature of the present invention.

At the right side of FIG. 7, there is a P-type well 60, with an N-type well 70 therein, to serve as a source of the transistor 502. The source can be coupled to the node Vbias in FIG. 5 via a metal contact layer (not shown). The P-type well 80 may help to separate the two transistors 501 and 502. The N-type substrate 30 and the N-type well 70 form the drain and the source of the transistor 502, respectively. The transistor 502 is turned ON when the gate 502G is biased. As illustrated in FIG. 5, the gate of the transistor 502 should be electrically connected to the source of the depletion mode transistor 501. That is, the node G2 and the node 501S in FIG. 7 should be electrically connected. It can be achieved by a metal layer (not shown) in the semiconductor manufacturing process. Please note that, the transistor 502 is a vertical transistor as well, which is another feature of the present invention.

Of course, in the semiconductor structure described above, the active devices should be separated from one another, as shown by the field oxide FOX in the drawing.

Figure 11:
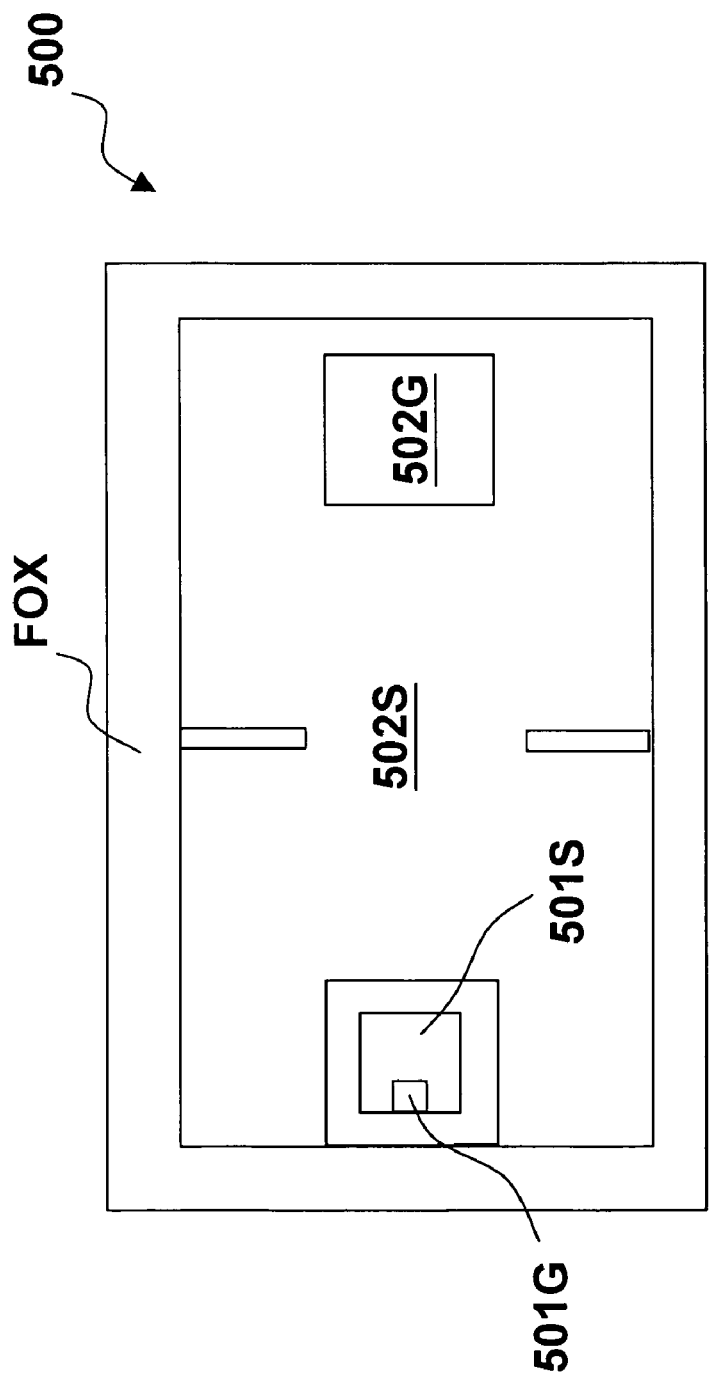
FIG. 11 is a top view diagram of an embodiment of the present invention.

FIG. 11 is a possible example of a top view of the aforementioned semiconductor structure. As shown in FIG. 11, the transistors 501 and 502 may be integrated as one discrete device very easily, because the transistors 501 and 502 are both vertical transistors.

Figure 8:
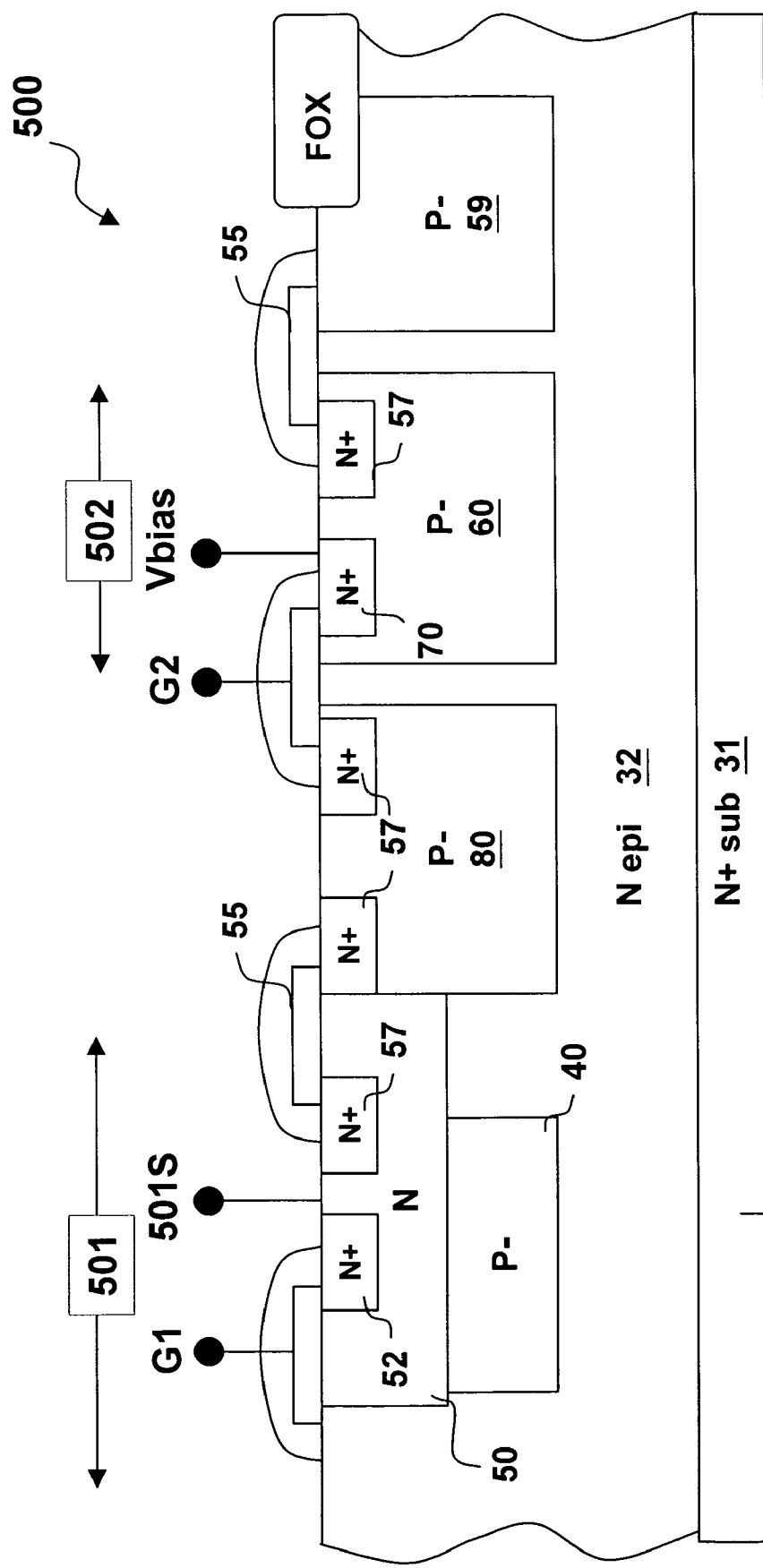
FIG. 8 is a semiconductor cross-sectional diagram of another preferred embodiment of the present invention.

Referring to FIG. 8, another embodiment of the aforementioned semiconductor structure is illustrated. As illustrated in FIG. 8, for improving the functionality of high voltage devices, the N-type substrate 30 may further include a heavily doped body 31 and an epitaxy layer 32, which is epitaxially grown and doped with N-type impurities. The N-type well 50 may further include an N-type heavily doped region 52 therein. The N-type well 70 may be a heavily doped well. The P-type wells 40, 60 and 80 may be lightly doped wells. The semiconductor structure as described above forms a better high voltage transistor device.

Furthermore, dummy layers such as a gate layer 55, an N-well 57 and a P-well 59 can be further provided to facilitate semiconductor process in fabrication. These layers may result from mask design and lithography requirements.

Figure 9:
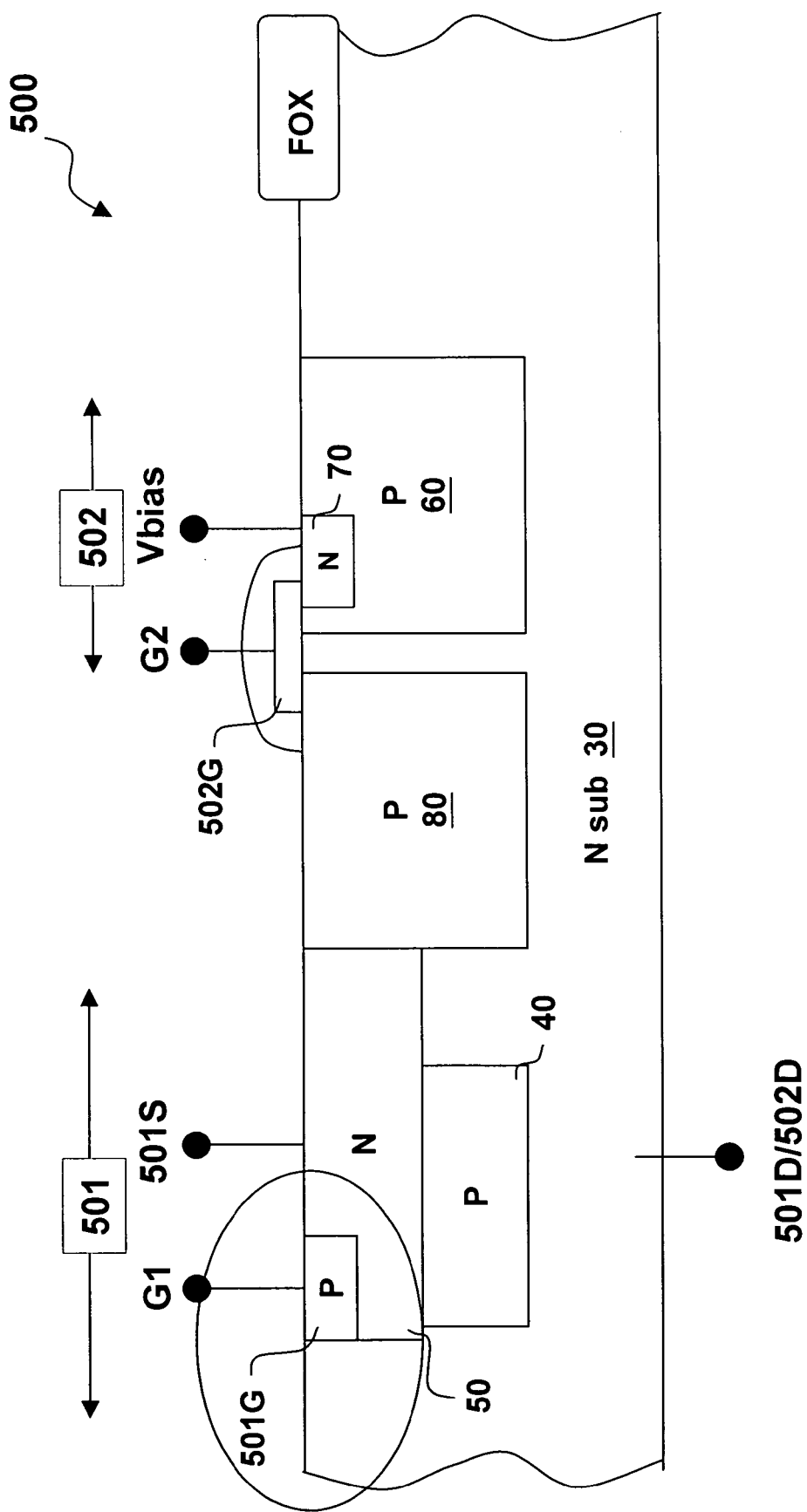
FIG. 9 is a semiconductor cross-sectional diagram of still another preferred embodiment of the present invention.

According to the present invention, the transistors 501 and 502 are not limited to MOSFETs. For example, the transistor 501 may instead be a junction transistor. One embodiment of the semiconductor structure thereof is illustrated in FIG. 9. The difference between FIG. 7 and FIG. 9 is marked with a circle in FIG. 9. Similarly, the transistor 502 may be a junction transistor as well.

Figure 10:
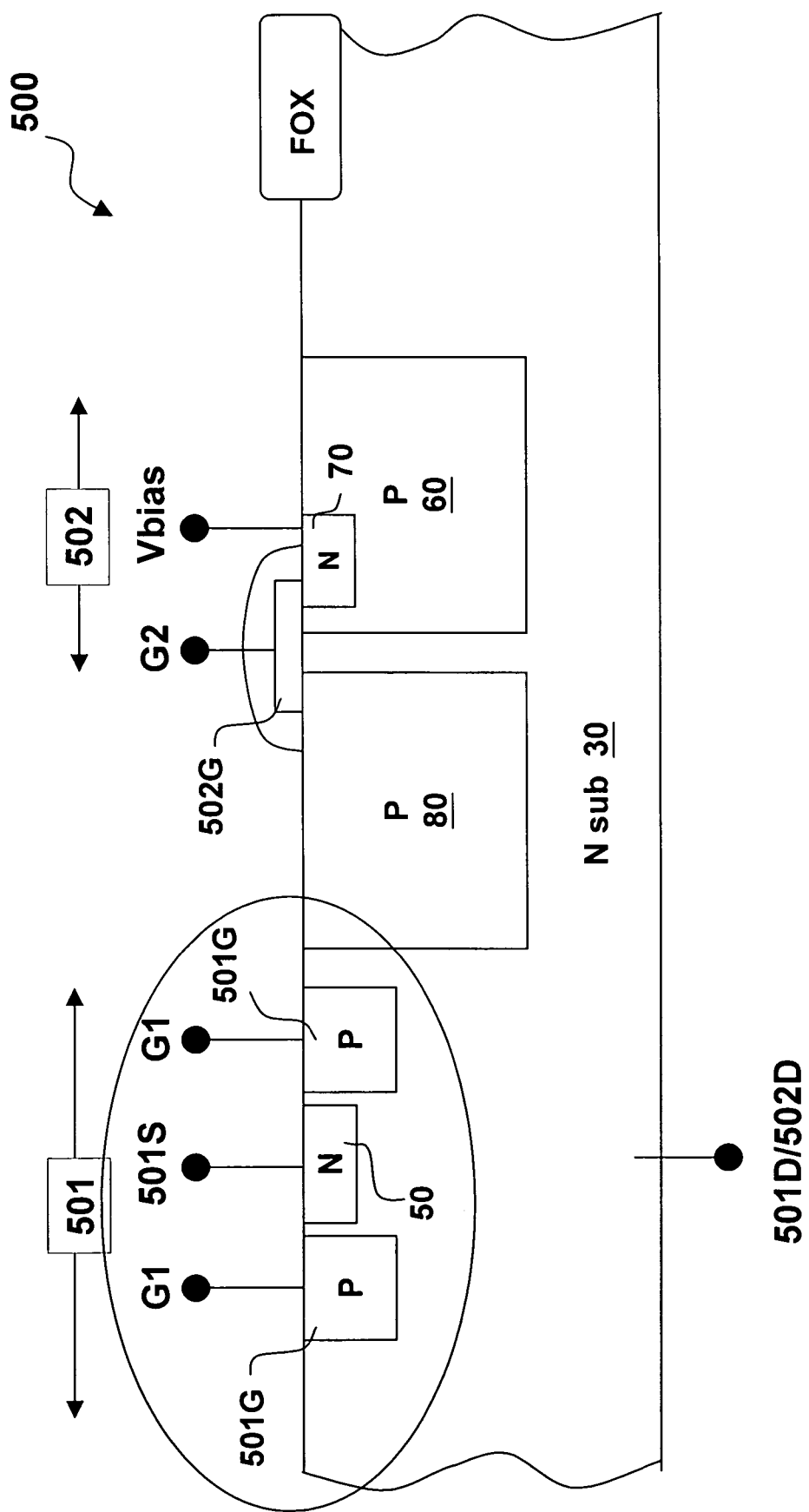
FIG. 10 is a semiconductor cross-sectional diagram of yet another embodiment of the present invention.

Moreover, FIG. 10 shows another embodiment employing the junction transistor as the transistor 501. In the embodiment in FIG. 9, the pinch-off function is achieved by the gate 501G and the P-type well 40 to turn OFF the transistor 501. However, in the embodiment illustrated in FIG. 10, the pinch-off function is achieved by the two gates 501G to turn OFF the transistor 501. In addition to this, the transistor 501 may be made of other types of junction transistor, or other types of transistors, which may be easily thought of by those skilled in the art in light of the teachings of the present invention.

Figure 12:
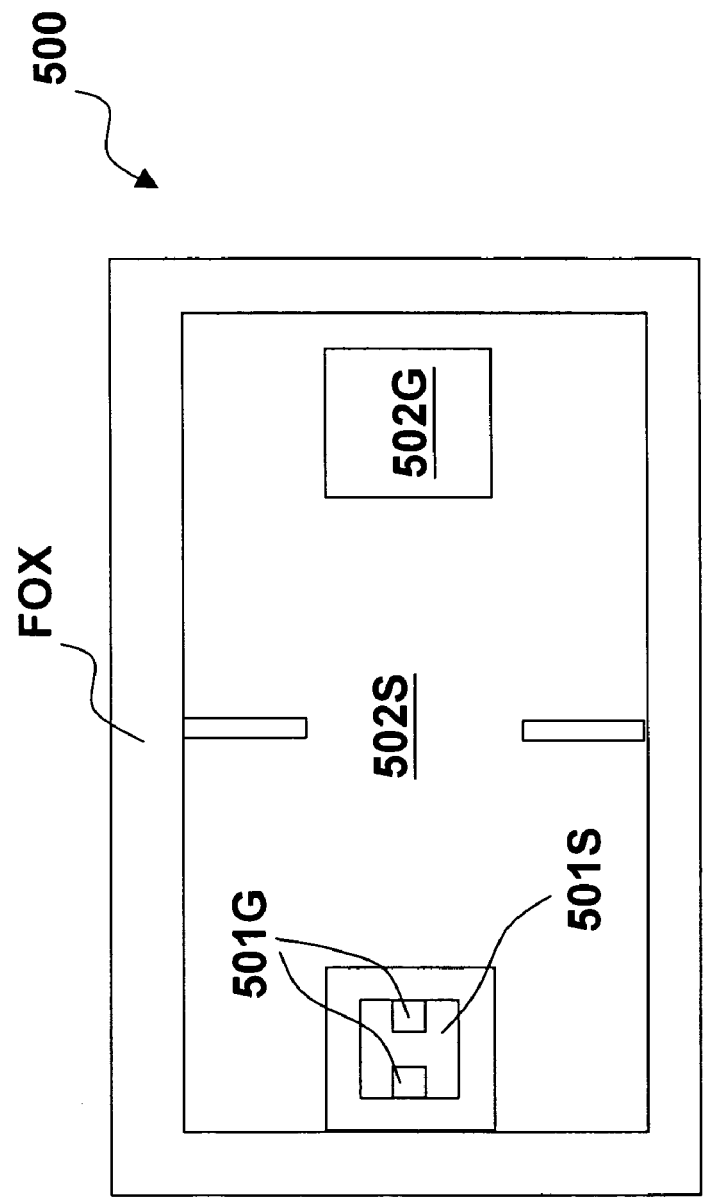
FIG. 12 is a top view diagram of the embodiment of the present invention shown in FIG. 10.

The top view of the semiconductor structure illustrated in FIG. 10 may be similar to FIG. 12.

In the embodiments shown in FIG. 9 and FIG. 10, for fabricating high voltage devices, the substrate 30 may include a body and an epitaxy layer, which is epitaxially grown. The doping densities of the body, the epitaxy layer and the wells may be adjusted according to requirements.

In summary, the main spirit of the present invention is the use of a depletion mode transistor and an enhancement mode transistor connected partially in parallel. The term "connected partially in parallel" means that the drains of the two transistors are coupled, and the source of the depletion mode transistor and the gate of the enhancement mode transistor are coupled. The depletion mode transistor controls the conduction of the enhancement mode transistor. Preferably, the transistors are vertical transistors. Within the same spirit, various modifications and variations can be made by those skilled in this art. For example, the start-up circuit is not necessarily one for starting up a power circuit, but may be employed for other applications. As another example, the mechanism to start up the power circuit 200 is not limited to charging the capacitor. Further, the internal structure of the power circuit 200 may be varied and different. Yet further, the well structures, the doping densities and the arrangement of the field oxides can be varied and different. The transistor 501 and the transistor 502 can be integrated into one discrete device or may be separated, and so on. Thus, it will be apparent to those skilled in the art that various modifications and variations can be made to the present invention without departing from the scope or spirit of the invention. In view of the foregoing, it is intended that the present invention cover all such modifications and variations, which should interpreted to fall within the scope of the following claims and their equivalents.

What is claimed is:

1. A start-up control device comprising:
   an N-type depletion mode transistor, including a drain for electrically connecting to an external power supply, and a gate normally grounded; and
   an N-type enhancement mode transistor, including a drain electrically connected to the external power supply, and a gate connected to a source of the depletion mode transistor, wherein the source of the N-type enhancement mode transistor is coupled to an external capacitor.

2. The start-up control device of claim 1, wherein the depletion mode transistor is a vertical transistor whose source or drain is at a bottom of a semiconductor substrate.

3. The start-up control device of claim 1, wherein the enhancement mode transistor is a vertical transistor whose source or drain is at a bottom of a semiconductor substrate.

4. The start-up control device of claim 1, wherein the source of the enhancement mode transistor is coupled to a capacitor.

5. The start-up control device of claim 1, wherein the gate of the depletion mode transistor is permanently grounded.

6. The start-up control device of claim 1 forming a start-up circuit for starting up a power circuit.

7. The start-up control device of claim 6, wherein the gate of the depletion mode transistor is grounded before the power circuit is started up, and the gate of the depletion mode transistor is controlled such that the depletion mode transistor is OFF after the power circuit is started up.

8. The start-up control device of claim 6, wherein the gate of the enhancement mode transistor is controlled to turn ON the enhancement mode transistor before the power circuit is started up, and the gate of the enhancement mode transistor is controlled to turn OFF the enhancement mode transistor after the power circuit is started up.

9. A start-up circuit, electrically connected between a power supply and a capacitor, the start-up circuit comprising:
   a depletion mode transistor normally in an ON state; and
   an enhancement mode transistor electrically connected with the depletion mode transistor partially in parallel, wherein drains of the enhancement mode transistor and the depletion mode transistor are coupled, and a source of the depletion mode transistor is coupled to a gate of the enhancement mode transistor, wherein the source of the enhancement mode transistor is coupled to the capacitor.

10. The start-up circuit of claim 9, wherein the depletion mode transistor is a vertical transistor, whose source or drain is at a bottom of a semiconductor substrate.

11. The start-up circuit of claim 9, wherein the enhancement mode transistor is a vertical transistor, whose source or drain is at a bottom of a semiconductor substrate.

12. The start-up circuit of claim 9, wherein the drains of the two transistors are electrically coupled to the power supply.

13. The start-up circuit of claim 9, wherein the two transistors are fabricated as integrated device.

14. A semiconductor device comprising:
   a substrate of a first conductivity type;
   a first well of a second conductivity type located in the substrate;
   a second well of the first conductivity type located in the substrate, wherein the second well and the substrate are normally conductive to each other;
   a first gate of the first conductivity type, capable of cooperating with the first well to pinch-off the conduction between the second well and the substrate when the first gate is biased;
   a third well of the first conductivity type located in the substrate;
   a fourth well of the second conductivity type located in the substrate, the fourth well separating the third well and the substrate; and
   a second gate of the first conductivity type, capable of activating the conduction between the third well and the substrate when the second gate is biased.

15. The semiconductor device of claim 14, wherein the first conductivity type is N-type, and the second conductivity type is P-type.

16. The semiconductor device of claim 14, wherein the first gate comprises a conductive layer on the substrate.

17. The semiconductor device of claim 14, wherein the second gate comprises a conductive layer on the substrate.

18. The semiconductor device of claim 14, wherein the second well further comprises a heavily doped region.

* * * * *